United States Patent [19]
Young

[11] Patent Number: 5,928,147
[45] Date of Patent: Jul. 27, 1999

[54] MAGNETIC RESONANCE IMAGING APPARATUS

[75] Inventor: Ian R. Young, Nr. Marlborough, United Kingdom

[73] Assignee: Picker International, Inc., Cleveland, Ohio

[21] Appl. No.: 09/025,522

[22] Filed: Feb. 18, 1998

[30] Foreign Application Priority Data

Feb. 18, 1997 [GB] United Kingdom .................... 9703321

[51] Int. Cl.⁶ ........................................... A61B 5/05
[52] U.S. Cl. .................... 600/410; 335/296; 335/298; 335/302; 335/306
[58] Field of Search ................ 335/296, 298, 335/299, 300, 301, 302, 306, 216; 324/319, 318, 322; 600/410, 422

[56] References Cited

U.S. PATENT DOCUMENTS 5,154,603 10/1992 Sepponen .
5,276,399 1/1994 Kasten et al. .
5,655,533 8/1997 Petropoulos et al. ................ 128/653.3
5,735,278 4/1998 Hoult et al. .......................... 128/653.2
5,798,680 8/1998 Abele et al. ............................ 335/301

FOREIGN PATENT DOCUMENTS 0 150 938  1/1985  European Pat. Off. .
0 470 095  4/1989  Germany .
2239523   3/1991  United Kingdom .

*Primary Examiner*—Marvin M. Lateef
*Assistant Examiner*—Eleni Mantis Mercader
*Attorney, Agent, or Firm*—Timothy B. Gurin; John J. Fry

[57] ABSTRACT

In magnetic resonance imaging (MRI) apparatus in which weight considerations and accessibility of the patient result in a magnet 1 with a large bore 2, in order to enable spectroscopy or other activities requiring large magnetic fields to nevertheless be carried out, a small magnet 4 with its own cryostat can be moved from an inoperative position A to an operative position B, in which the large magnet acts as a shield winding for the small magnet.

19 Claims, 1 Drawing Sheet

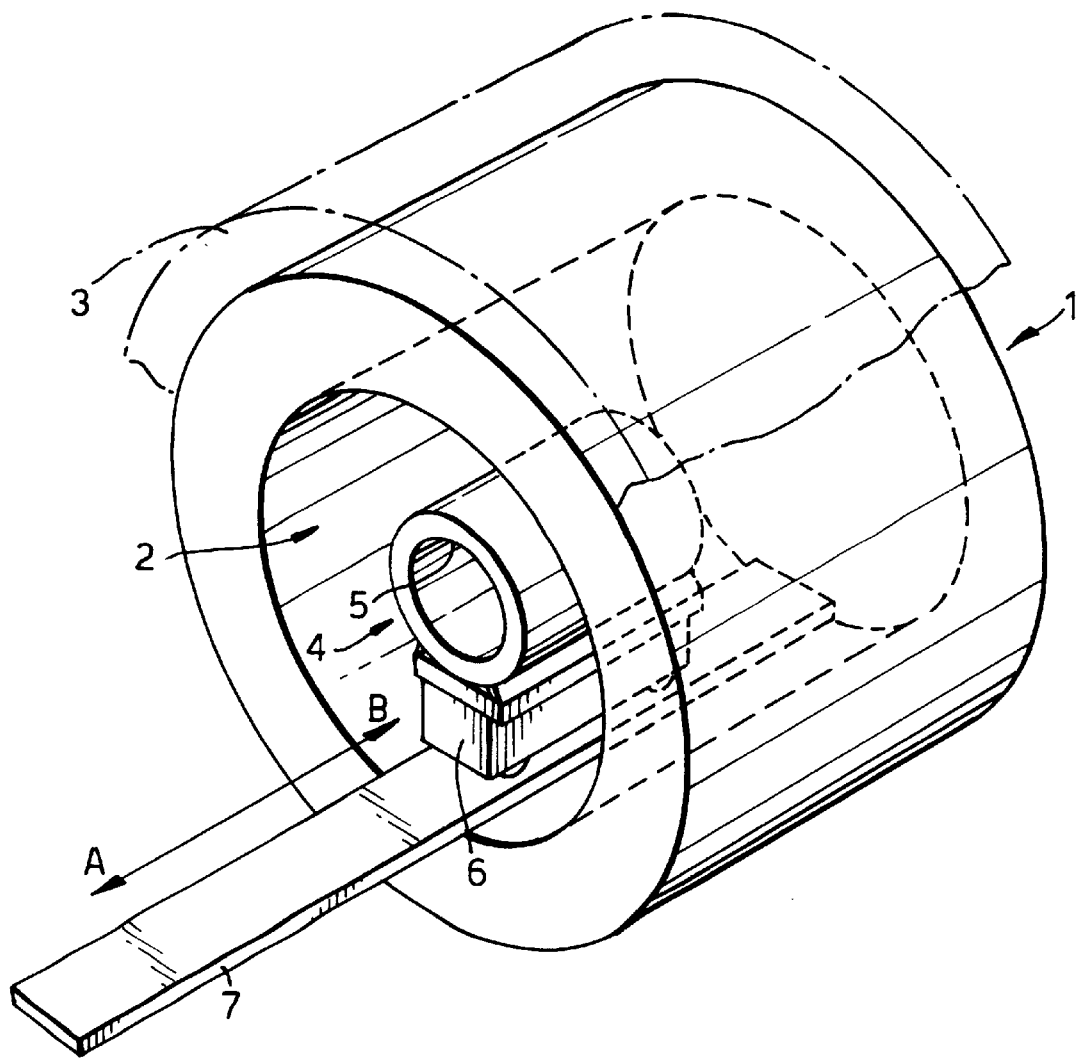

MAGNETIC RESONANCE IMAGING APPARATUS

BACKGROUND

This invention relates to magnetic resonance imaging apparatus.

Magnetic resonance imaging (MRI) is used in medicine to produce images of the internal organs of a patient being examined. In MRI a static magnetic field is applied to the body of the patient to define an equilibrium of magnetic alignment in the region of the body being examined. A radio frequency field is then applied to the region being examined in a direction orthogonal to the static magnetic field direction to excite magnetic resonance in the region. This resonance produces signals in r.f. coils placed adjacent the patient's body.

Within this general principle of operation a wide of variety of apparatus designs have evolved to meet a large number of different requirements. This means that whilst a particular design of apparatus is very suitable for one type of application it is unsuitable for another. Consequently if a user, such as a hospital, wishes to be in a position to provide a wide variety of MRI based facilities/services/treatments then it would have to become involved in the purchase of a number of different tailor-made MRI systems.

In designing an MRI system there are a variety of mutually conflicting constraints. One such constraint is the conflict between providing a high magnetic field strength on the one hand and patient accessibility on the other. Another constraint concerns the weight of the field magnetic assembly where, for example, the equipment is to be installed in an upper floor of a building, MRI equipment being very heavy because of the employment of massive high powered magnets.

Therefore, in designing MRI equipment design compromises have to be struck or if one aspect of the design is given priority there will be consequential drawbacks in other areas.

The present invention is concerned with resolving one of these design conflicts where the weight of the MRI equipment has to be kept below a certain level thus limiting the main magnetic field to a relatively low value and yet it is desired to use the equipment to carry out certain activities/functions (e.g. spectroscopy) where it is necessary to have a magnetic field which is higher than that which can be generated by the earlier mentioned weight-constrained main magnetic system.

To produce a high field sufficient for spectroscopy would be impracticable with a large bore magnet but would be practicable with a small bore magnet. A problem with such a high field magnet would be the question of shielding, particularly if used in the vicinity of a magnet for magnetic resonance imaging.

Active shielded magnets have been proposed, in which the high field magnet is provided with an outer set of windings, surrounding the main windings for generating the high field. The outer windings are designed to produce zero field on the outside of the windings, because they oppose the field from the high field magnet in that region.

In conventional actively shielded magnets, the two sets of windings are contained inside a common cryostat.

SUMMARY

The present invention is particularly concerned with providing an arrangement whereby magnetic resonance spectroscopy can be carried out using an MRI system which is not designed for that purpose.

According to the present invention an MRI system comprises a main field magnet having a relatively large clear material section to facilitate interventional MRI and having a relatively low main magnetic field generating capability in combination with a relatively small dimensioned field magnet capable of generating a relatively high magnetic field, the small field magnet having means for making it mobile so that it can be transported between an inoperative position outside the large magnet to an operative position inside the large magnet where the latter acts as a shield winding for the small powerful magnet.

With this arrangement spectroscopy (or other activities requiring relatively large magnetic fields) can be carried out using a very large but low powered magnet system that is designed primarily for interventional MRI.

Thus the extra facility (of spectroscopy for example) can be provided at a relatively low cost because the main very large but low powered magnet is also used to provide the shielding for the relatively small powerful magnet.

DRAWINGS

FIG. 1 is a perspective view of an apparatus according to the present invention.

DESCRIPTION

How the invention may be carried out will now be described with reference to FIG. 1. In the arrangement illustrated in the drawing a very large magnet system 1 has a clear material section 2 (i.e. bore) of around 2.5 meters and a cryostat 3 (shown in fragmentary diagrammatic form) and is designed specifically for interventional MRI i.e. in which medical procedures such as insertion of a catheter or incision with a surgical implement can be carried out while the patient is being imaged in the bore of the magnet. This large magnet system 1 is essentially a low field system because of weight constraints and is unsuitable for spectroscopy. The magnet is a superconducting magnet wound on a cylindrical former, and may comprise six or more discrete coils with numbers of turns arranged so that they approximate a continuous short solenoidal magnet with correcting large end coils. This is housed in a helium-filled can, with concentric heat shields inside and outside the coils. This assembly is contained in a cryostat which is evacuated to provide vacuum insulation. The field of the magnet system is relatively low, say, less than 0.25 T (Tesla).

There are certain applications in which the spectroscopy technique could be very useful but these require relatively high magnetic fields compared with the field that can be generated by the large magnet system.

In order to enable the large magnet system to be used for spectroscopy a small relatively high powered magnet 4 having a clear bore 5 of only 80 centimeters is provided. The field generated by the small magnet is at least 1.5 T.

The small magnet 4 has its own cryostat and is a superconducting magnet of the same construction, only smaller, as the main magnet. It is constructed as a unit and mounted on a trolley 6 so that it can be wheeled from an inoperative position A outside the large magnet 1 into an operative position B within the large magnet 1 along a support 7, which could be formed by rails.

In the operative position B of the small magnet 4 the large magnet 1 acts as the shield winding for the small magnet 4 to thus stop the escape of what would otherwise be a very large strong field.

With this arrangement the cost of the small spectroscopy magnet 4 is kept low because it is not provided with its own shield winding and it is thus possible to provide the extra spectroscopy facility at relatively low cost.

It will be appreciated that for normal imaging, current is passed through the coils of the main magnet 1, and an r.f. field is applied in a direction orthogonal to the main magnetic field to excite nuclear magnetic resonance in the region being imaged. Magnetic field gradients are also applied, so that signals induced in r.f. receive coils enable the region in question to be imaged.

The current in the coils of the main field magnet is not necessarily the same when it is being used as a shield as when it is being used as the main field generator for imaging.

The shield current is derived in the following manner. The field pattern of the main magnet outside the magnet is calculated. The small magnet is then designed so that its field pattern outside the small magnet cancels the field pattern of the main magnet (outside the main magnet). The current in the small magnet is then adjusted to produce the desired field strength within its bore. Finally, the current in the main magnet is then adjusted to achieve as near as possible cancellation of the field outside the main magnet 1.

The small magnet is not provided with gradient coils since the different frequencies of resonance of e.g. protons in different types of tissue are being measured, in order to evaluate the quantities of such different types of tissue within the region of the patient being excited to resonance. An image is not obtained. The small magnet is provided with its own transmit and receive r.f. coils. Surface coils placed on the body of the patient could be used for receiving r.f. signals when either magnet is used.

The low field system is applicable to magnets producing a main field of less than 0.5 T, and the high field system applicable to fields of 1.5 T and above. In fact, the low field system could be less than 0.3 T and the high field system could be greater than 2.0 T.

While both magnets are superconducting magnets, the invention is applicable to non-superconducting magnets.

Of course, modifications may be made without departing from the scope of the invention. Thus, the main magnet may itself be actively shielded or have an iron shield. In normal operation of the main magnet, this would tend to counter-act the field of the main magnet which, since the magnet is so big, could spread a very long way. Then, when the small magnet is being used, the current in the outer large magnet is adjusted so that the net effect of it, and its own shield, is such as to give zero field as near as practicable outside the whole assembly.

The invention has been described with reference to the preferred embodiment. Obviously, modifications and alterations will occur to others upon reading and understanding the preceding description. It is intended that the invention be construed as including all such modifications and alterations insofar as they come within the scope of the appended claims or the equivalents thereof.

I claim:

1. A magnet apparatus comprising:
   a main field large magnet having a relatively large clear material section to facilitate interventional MRI and having a relatively low main magnetic field generating capability;
   a relatively small dimensioned main field magnet having a main magnetic field generating capability relatively greater than that of the large magnet; and
   means for transporting the small dimensioned main field magnet between an inoperative position outside the large magnet to an operative position inside the large magnet, the large magnet acting as a shield winding for the small dimensioned main field magnet when the small dimensioned main field magnet is in the operative position.

2. The apparatus of claim 1 wherein the small dimensioned main field magnet is movable along rails between the inoperative and operative positions.

3. The apparatus of claim 2 wherein the large main field magnet and small dimensioned main field magnet are superconducting.

4. The apparatus of claim 1 wherein the large main field magnet and small dimensioned main field magnet are superconducting.

5. The apparatus of claim 1 wherein the clear material section is a generally cylindrical bore.

6. The apparatus of claim 1 wherein the small main field dimensioned magnet generates a magnetic field having a strength suitable for use in magnetic resonance spectroscopy.

7. A magnetic resonance apparatus comprising:
   a first main field magnet, the first main field magnet capable of generating a main magnetic field having a strength suitable for use in magnetic resonance imaging within a first clear material region adapted to receive the anatomy of a human patient;
   a second main field magnet, the second main field magnet capable of generating a main magnetic field having a strength suitable for use in magnetic resonance spectroscopy within a second clear material region;
   the relative positions of the first and second main field magnets being selectably adjustable such that the second main field magnet may be selectively inserted within the clear material region of the first main field magnet.

8. The apparatus of claim 7 wherein the first main field magnet generates a magnetic field which substantially cancels the magnetic field generated by the second main field magnet in the region outside the first main field magnet when the second main field magnet is inserted in the clear material region of the first main field magnet.

9. The apparatus of claim 8 wherein the clear material region of the second magnet is adapted to receive the anatomy of human patient.

10. The apparatus of claim 8 wherein the clear material region of the second main field magnet is substantially cylindrical.

11. The apparatus of claim 7 wherein the first main field magnet is actively shielded.

12. The apparatus of claim 7 wherein the clear material region of the first main field magnet has a longitudinal axis and second main field magnet is constrained for movement along the longitudinal axis.

13. An apparatus comprising:
   a first main field magnet defining a first clear material section of a size sufficient to accept the anatomy of a human patient and capable of generating a first main magnetic field within the first clear material section;
   a second main field magnet defining a second clear material section of a size sufficient to accept the anatomy of a human patient and capable of generating a second main magnetic field within the second clear material section;
   the relative positions of the first and second magnets being selectively adjustable between a first position in which access to a patient disposed in the first clear material area is facilitated and a second position in which a magnetic field generated by the first magnet substantially cancels the magnetic field generated by the second magnet in the region external to the first magnet.

14. The apparatus of claim 13 wherein the first main field magnetic field is of a strength suitable for use in magnetic resonance imaging.

15. The apparatus of claim 14 wherein the second main field magnetic field is of a strength suitable for use in magnetic resonance spectroscopy.

16. The apparatus of claim 14 wherein, when the first and second main field magnets in the second relative position, the second magnet is inserted in the clear material section of the first magnet.

17. The apparatus of claim 16 wherein the clear material section of the first main field magnet is substantially cylindrical.

18. The apparatus of claim 17 wherein the clear material section of the first main field magnet has a diameter of approximately 2.5 meters.

19. The apparatus of claim 16 wherein the second main field magnetic field is of a strength suitable for use in magnetic resonance spectroscopy.

* * * * *